United States Patent
Choi

(10) Patent No.: US 7,647,218 B2
(45) Date of Patent: Jan. 12, 2010

(54) MOS VARACTOR PROPERTY DETECTION METHOD AND MOS VARACTOR MANUFACTURING METHOD USING THE SAME

(75) Inventor: Jung Hyun Choi, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 463 days.

(21) Appl. No.: 11/585,454

(22) Filed: Oct. 24, 2006

(65) Prior Publication Data

US 2007/0093008 A1     Apr. 26, 2007

(30) Foreign Application Priority Data

Oct. 24, 2005    (KR) ...................... 10-2005-0100143

(51) Int. Cl.
*G06F 17/50* (2006.01)
*G06F 17/10* (2006.01)

(52) U.S. Cl. ............. 703/14; 703/2; 257/E29.344; 257/E29.345; 438/379; 716/11

(58) Field of Classification Search ............. 703/2, 703/13, 14; 438/171, 379; 257/E29.344, 257/E29.345; 332/136; 716/1, 2, 4, 5, 11
See application file for complete search history.

(56) References Cited

U.S. PATENT DOCUMENTS 7,223,667 B2 *   5/2007   Tseng ................... 438/379
7,235,862 B2 *   6/2007   Bulucea ................. 257/595
7,276,746 B1 *  10/2007   Xu et al. ............... 257/258
2003/0067026 A1 *   4/2003   Bulucea ................ 257/303
2005/0212048 A1 *   9/2005   Litwin ................. 257/350

OTHER PUBLICATIONS

Victory et al., J. A Physically Based, Scalable MOS Varactor Model and Extraction Methodology for RF Applications, IEEE Tranactions on Electron Devices, vol. 52, No. 7, Jul. 2005, pp. 1343-1353.*

* cited by examiner

*Primary Examiner*—Russell Frejd
(74) *Attorney, Agent, or Firm*—Saliwanchik, Lloyd & Saliwanchik

(57) ABSTRACT

Disclosed is a method for detecting properties of a Metal Oxide Silicon (MOS) varactor, which includes: establishing a MOS varactor model equation in conjunction with an area of a gate; calculating values of the coefficients of the MOS varactor model equation through measurements for test materials; and extracting the properties of a capacitor of the MOS varactor using the calculated values of the coefficients. According to the method, the MOS varactor model equation can be expressed by $C_{gate}=[Ci_{gate} \times \text{Area} + Cp_{gate} \times \text{Perimeter}] \times N$, wherein, $C_{gate}$ denotes gate capacitance for voltage applied to the gate, $Ci_{gate}$ denotes intrinsic gate capacitance, $Cp_{gate}$ denotes perimeter gate capacitance, and N denotes the number of gate fingers. The MOS varactor model equation can be applicable to various sized capacitors, so that it is possible to estimate a gate capacitance for voltage applied to a gate, considering the differences due to the surface shapes of a device.

13 Claims, 7 Drawing Sheets

MOS VARACTOR PROPERTY DETECTION METHOD AND MOS VARACTOR MANUFACTURING METHOD USING THE SAME

RELATED APPLICATION(S)

This application claims the benefit, under 35 U.S.C. § 119(e), of Korean Patent Application Number 10-2005-0100143 filed Oct. 24, 2005, which is incorporated herein by reference in its entirety.

FIELD OF THE INVENTION

The present invention relates to a method for detecting properties of a Metal Oxide Silicon (MOS) varactor and a method for manufacturing the MOS varactor by using the same, and more particularly, to a method for detecting properties of a MOS varactor, which can precisely detect the properties of a MOS varactor regardless of the area and perimeter of a gate and the number of gate fingers, and a method for manufacturing the MOS varactor by using the same.

BACKGROUND OF THE INVENTION

With the recent development of wireless mobile communication, the importance of RF application devices has increased. Accordingly, an accumulation mode MOS varactor has been used in applications requiring a wide tuning range such as with a Voltage Controlled Oscillator (VCO). In an environment in which supply voltage becomes lower as technology develops, the properties of a MOS varactor, such as its high quality, extended tuning range, low noise and low consumption power, fully show the usefulness thereof.

Such a MOS varactor has been designed through mathematical nonlinear modeling.

FIGS. 1 and 2 are diagrams schematically illustrating the general structure of a MOS varactor, which show a structure for extracting model parameters in the mathematical nonlinear modeling of the MOS varactor.

As expressed by equation 1 below, a conventional MOS varactor model equation includes parameters $C_{gmin0}$ and $dC_{g0}$ for the size of a C-V curve and parameters $dV_{gs0}$ and $V_{gnorm}$ for the slope of the curve, and extracts the parameters from the structure of a single size.

$$C_{gate} = C_{gmin0} + dC_{g0} \times \left[1 + \tanh\left(\frac{V_g - dV_{gs0}}{V_{gnorm}}\right)\right]. \quad \text{Equation 1:}$$

In equation 1, the parameters $C_{gmin0}$, $dC_{g0}$, $dV_{gs0}$ and $V_{gnorm}$ denote gate capacitance coefficients, and $V_g$ denotes gate voltage applied from an external source. Such a MOS varactor model equation shows high accuracy for a single area, but shows low accuracy when the same parameters are applied to elements having different areas.

FIGS. 3 to 7 are graphs illustrating comparisons of the differences between values estimated by the conventional MOS varactor model equation and actually measured values, and show gate capacitance values for an applied gate voltage.

FIG. 3 is a graph reflecting the comparison when a width W, a length L and the number N of fingers are 2 μm, 1 μm and 60, respectively. Here, the total area of the gate is 120 μm². As illustrated in FIG. 3, it can be seen that a large error occurs towards both ends of the S-shaped curve, and the measured RMS error is 5.43%. The measured values are expressed by dots and the values estimated by the conventional MOS varactor model equation are expressed by a solid line.

FIG. 4 is a graph reflecting the comparison when a width W, a length L and the number N of fingers are 5 μm, 1 μm and 48, respectively. Here, the total area of the gate is 240 μm². As illustrated in FIG. 4, it can be seen that a large error occurs towards both ends of the S-shaped curve, and the measured RMS error is 7.28%. The measured values are expressed by dots and the values estimated by the conventional MOS varactor model equation are expressed by a solid line.

FIG. 5 is a graph reflecting the comparison when a width W, a length L and the number N of fingers are 5 μm, 2 μm and 48, respectively. Here, the total area of the gate is 480 μm². As illustrated in FIG. 5, it can be seen that a large error occurs towards both ends of the S-shaped curve, and the measured RMS error is 5.85%. The measured values are expressed by dots and the values estimated by the conventional MOS varactor model equation are expressed by a solid line.

FIG. 6 is a graph reflecting the comparison when a width W, a length L and the number N of fingers are 10 μm, 1 μm and 96, respectively. Here, the total area of the gate is 960 μm². As illustrated in FIG. 6, it can be seen that a large error occurs towards both ends of the S-shaped curve, and the measured RMS error is 7.97%. The measured values are expressed by dots and the values estimated by the conventional MOS varactor model equation are expressed by a solid line.

FIG. 7 is a graph reflecting the comparison when a width W, a length L and the number N of fingers are 10 μm, 2 μm and 96, respectively. Here, the total area of the gate is 1920 μm². As illustrated in FIG. 7, it can be seen that a large error occurs towards both ends of the S-shaped curve, and the measured RMS error is 11.52%. The measured values are expressed by dots and the values estimated by the conventional MOS varactor model equation are expressed by a solid line.

According to the conventional MOS varactor model equation as described above, it is difficult to simultaneously satisfy various sizes of capacitors in one model. Therefore, it is necessary to perform modeling according to sizes of the capacitors.

SUMMARY OF THE INVENTION

In accordance with one aspect of the present invention, there is provided a method for detecting properties of a Metal Oxide Silicon (MOS) varactor, the method including the steps of: establishing a MOS varactor model equation in conjunction with an area of a gate; calculating values of coefficients constituting the MOS varactor model equation through measurement for test materials; and extracting the properties of a capacitor of the MOS varactor by using the calculated values of the coefficients.

According to the method, the MOS varactor model equation can be expressed by the equation below $$C_{gate} = [Ci_{gate} \times \text{Area} + Cp_{gate} \times \text{Perimeter}] \times N,$$

where, $C_{gate}$ denotes gate capacitance for voltage applied to the gate, $Ci_{gate}$ denotes intrinsic gate capacitance, $Cp_{gate}$ denotes perimeter gate capacitance, and N denotes a number of gate fingers.

In accordance with another aspect of the present invention, there is provided a method for manufacturing a Metal Oxide Silicon (MOS) varactor, the method including the steps of: establishing a MOS varactor model equation considering an area of a gate; calculating values of coefficients constituting the MOS varactor model equation through measurement for test materials; extracting the properties of a capacitor of the MOS varactor by using the calculated values of the coefficients; and manufacturing the MOS varactor by using the extracted properties of the capacitor.

According to the method, a MOS varactor model equation applicable to various areas and perimeters of a capacitor is proposed, so that it is possible to estimate a gate capacitance for voltage applied to a gate in consideration of the difference due to the surface shapes of a device.

DETAILED DESCRIPTION OF THE INVENTION

Hereinafter, the preferred embodiment of the present invention will be described in detail with reference to the accompanying drawings.

The present invention incorporates the fact that, in establishing a MOS varactor model equation, capacitance has both an area component and a perimeter component for each structure as expressed by equation 2.

$$C_{gate} = Ci_{gate} \times \text{Area} + Cp_{gate} \times \text{Perimeter} \qquad \text{Equation 2:}$$

In equation 2, $Ci_{gate}$ denotes intrinsic gate capacitance and $Cp_{gate}$ denotes perimeter gate capacitance. That is, $Ci_{gate}$ is the capacitance of an area component of a gate, and $Cp_{gate}$ is the capacitance of a perimeter component of the gate. The C-V characteristics of $Ci_{gate}$ and $Cp_{gate}$ may be expressed by equations 3 and 4.

$$Ci_{gate} = Ci_{gmin0} + dCi_{go} \times \left[1 + \tanh\left(\frac{V_g - dVi_{gs0}}{Vi_{gnorm}}\right)\right] \qquad \text{Equation 3:}$$

$$Cp_{gate} = Cp_{gmin0} + dCp_{go} \times \left[1 + \tanh\left(\frac{V_g - dVp_{gs0}}{Vp_{gnorm}}\right)\right] \qquad \text{Equation 4:}$$

In equations 3 and 4, $Ci_{g\,min\,0}$, $dCi_{go}$, $dVi_{gs0}$ and $Vi_{gnorm}$ denote intrinsic gate capacitance coefficients, and $CP_{g\,min\,0}$, $dCp_{go}$, $dVp_{gs0}$ and $Vp_{gnorm}$ denote perimeter gate capacitance coefficients.

That is, as compared to a conventional MOS varactor model equation, capacitance can be divided into components corresponding to the area Ci and the perimeter Cp, and then parameters can be extracted for each component, which results in the generation of a final MOS varactor model equation. As a result, the final MOS varactor model equation becomes a scalable MOS varactor model equation applicable to various areas and perimeters.

The MOS varactor model equation according to the present invention, which can be derived as described above and includes an area component and a perimeter component may be expressed by equation 5. In equation 5, N denotes the number of gate fingers.

$$C_{gate} = [Ci_{gate} \times \text{Area} + Cp_{gate} \times \text{Perimeter}] \times N \qquad \text{Equation 5:}$$

In equation 5, $Ci_{gate}$ and $Cp_{gate}$ can correspond to equations 3 and 4, respectively.

According to the present invention, the MOS varactor model equation can be established as expressed by equation 5, and the values of the coefficients can be acquired through measurements for various test materials.

Hereinafter, the propriety of the MOS varactor model equation according to the present invention obtained through the process as described above will be described with reference to FIGS. 8 to 12.

FIGS. 8 to 12 are graphs illustrating comparisons of differences between values estimated by the MOS varactor model equation of the present invention and actually measured values, and show gate capacitance values for applied gate voltage.

Figure 1:
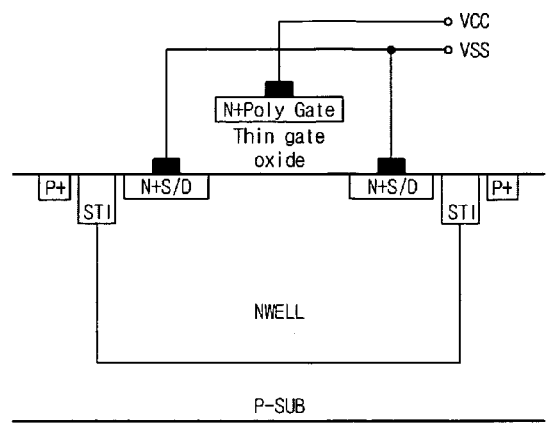
FIGS. 1 and 2 are diagrams schematically illustrating the general structure of a MOS varactor.
Figure 2:
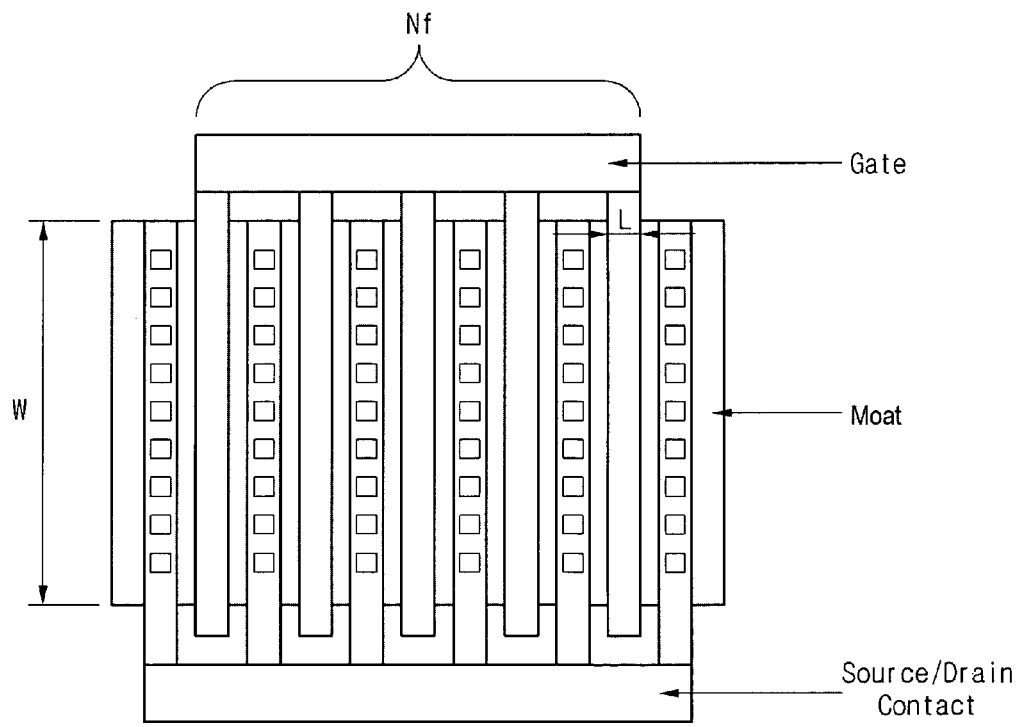
Figure 3:
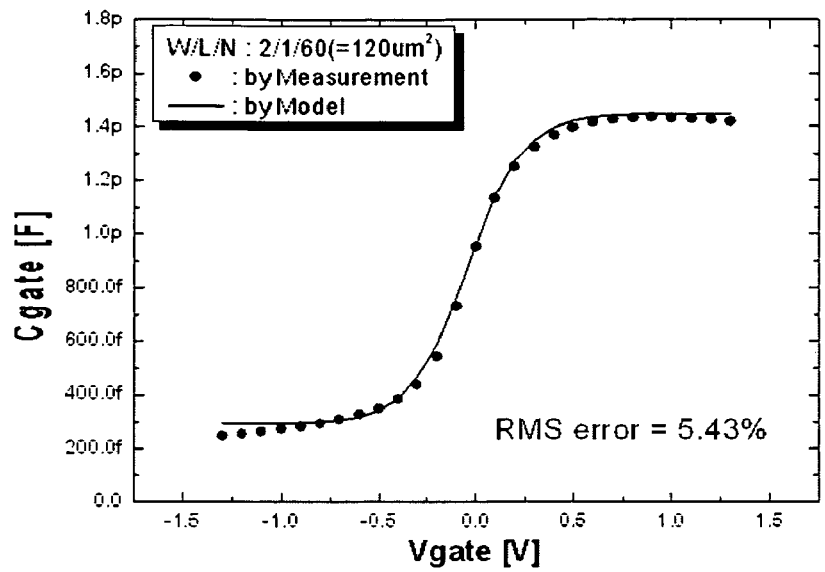
FIGS. 3 to 7 are graphs illustrating comparisons of differences between values estimated by a conventional MOS varactor model equation and actually measured values.
Figure 4:
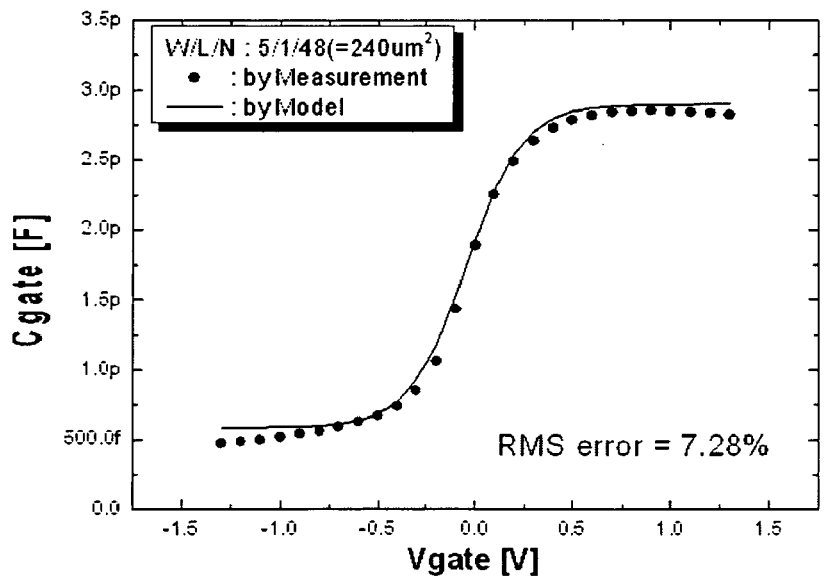
Figure 5:
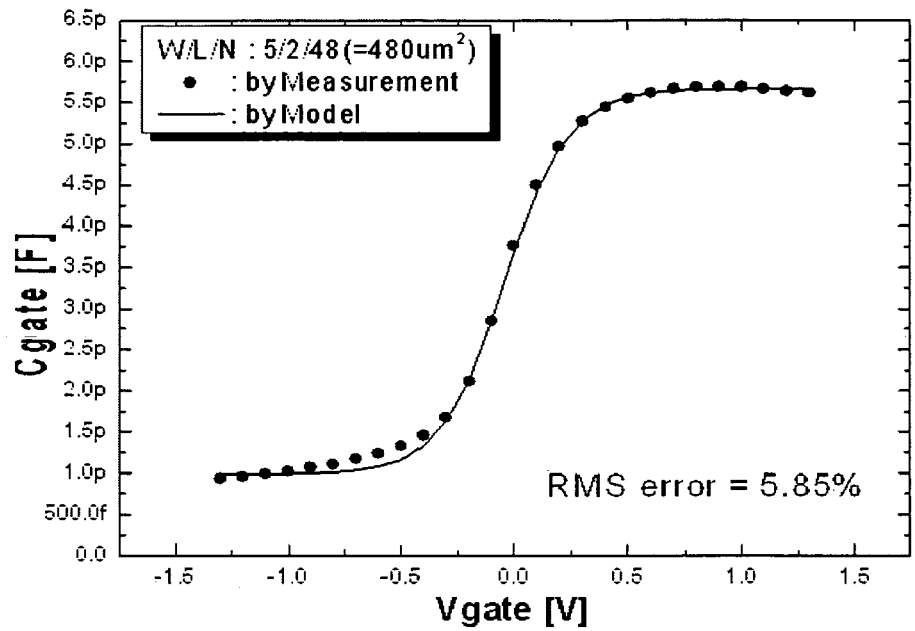
Figure 6:
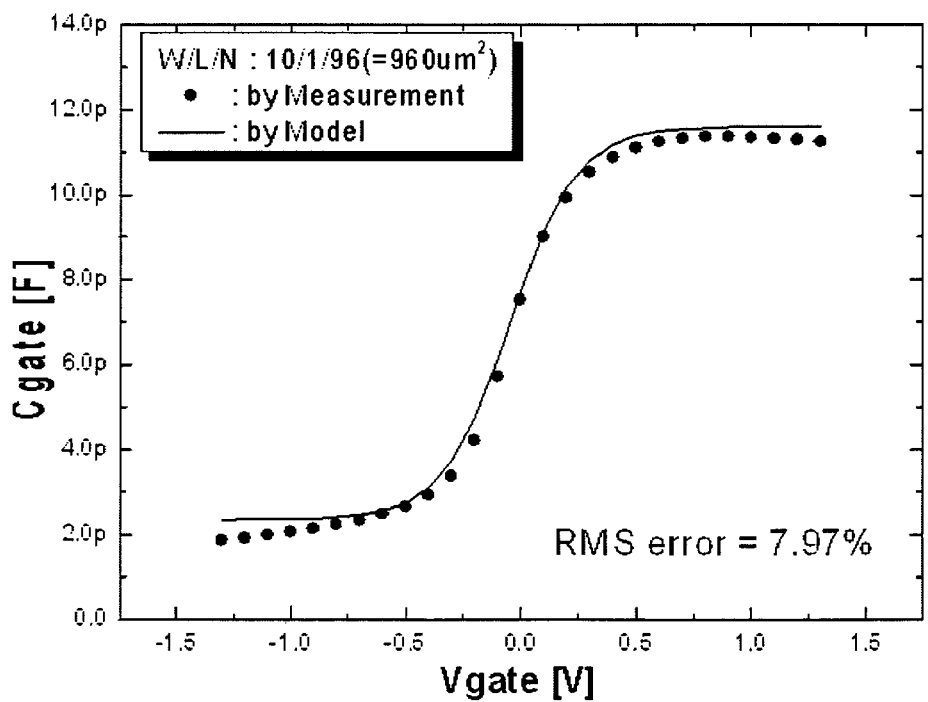
Figure 7:
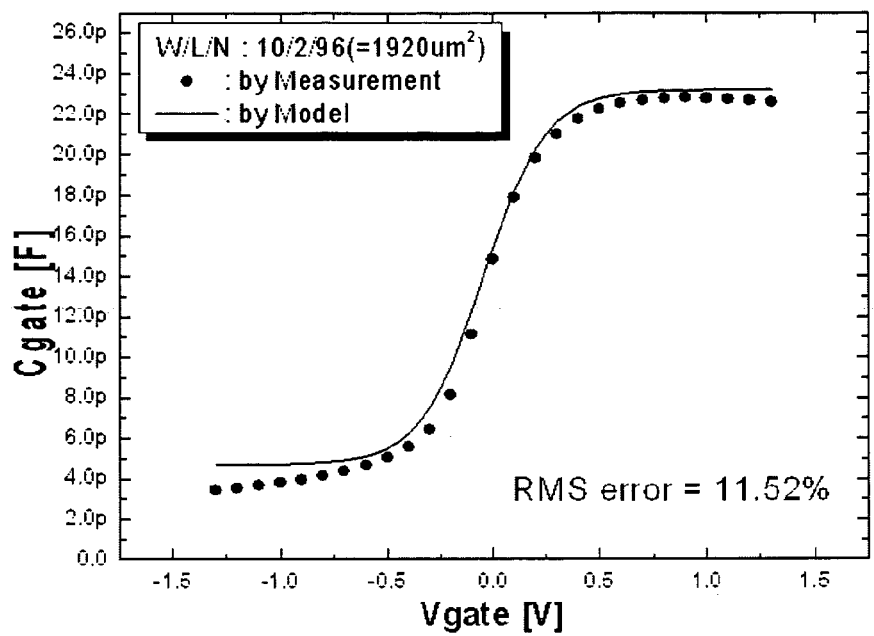
Figure 8:
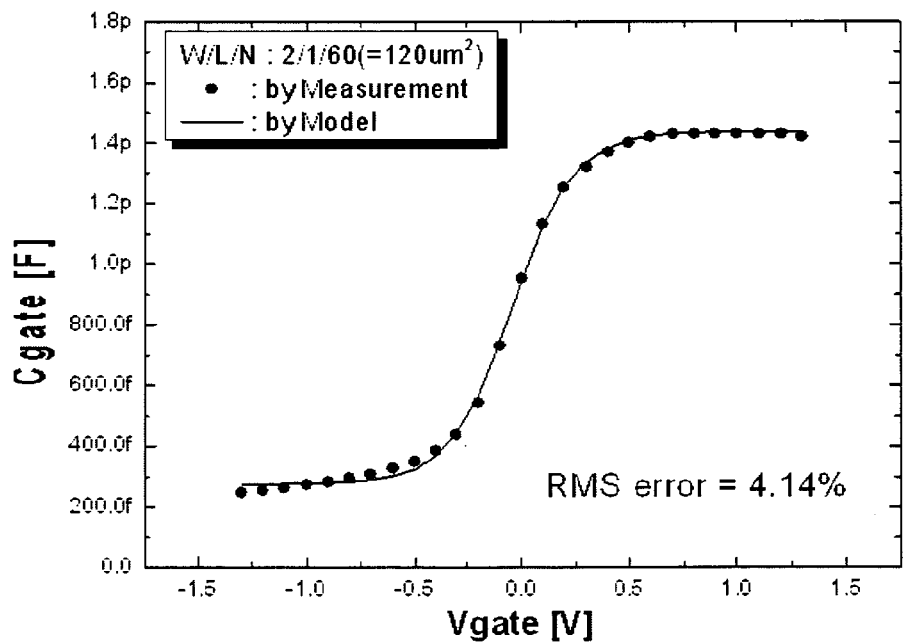
FIGS. 8 to 12 are graphs illustrating comparisons of differences between values estimated by a MOS varactor model equation of the present invention and actually measured values.

FIG. 8 is a graph reflecting the comparison when a width W, a length L and the number N of fingers are 2 μm, 1 μm and 60, respectively. Here, the total area of the gate is 120 μm$^2$. As illustrated in FIG. 8, it can be seen that the estimated values are close to the actually measured values over the entire S-shaped curve, and the measured RMS error is 4.14%. The measured values are expressed by dots and the values estimated by the MOS varactor model equation of the present invention are expressed by a solid line.

Figure 9:
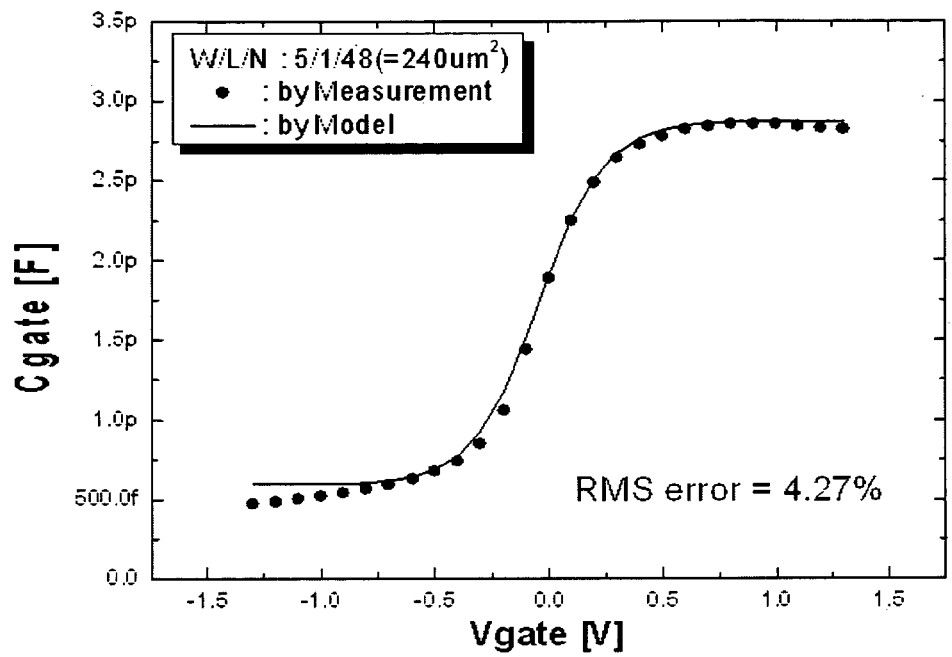

FIG. 9 is a graph reflecting the comparison when a width W, a length L and the number N of fingers are 5 μm, 1 μm and 48, respectively. Here, the total area of the gate is 240 μm$^2$. As illustrated in FIG. 9, it can be seen that the estimated values are close to the actually measured values over the entire S-shaped curve, and the measured RMS error is 4.27%. The measured values are expressed by dots and the values estimated by the MOS varactor model equation of the present invention are expressed by a solid line.

Figure 10:
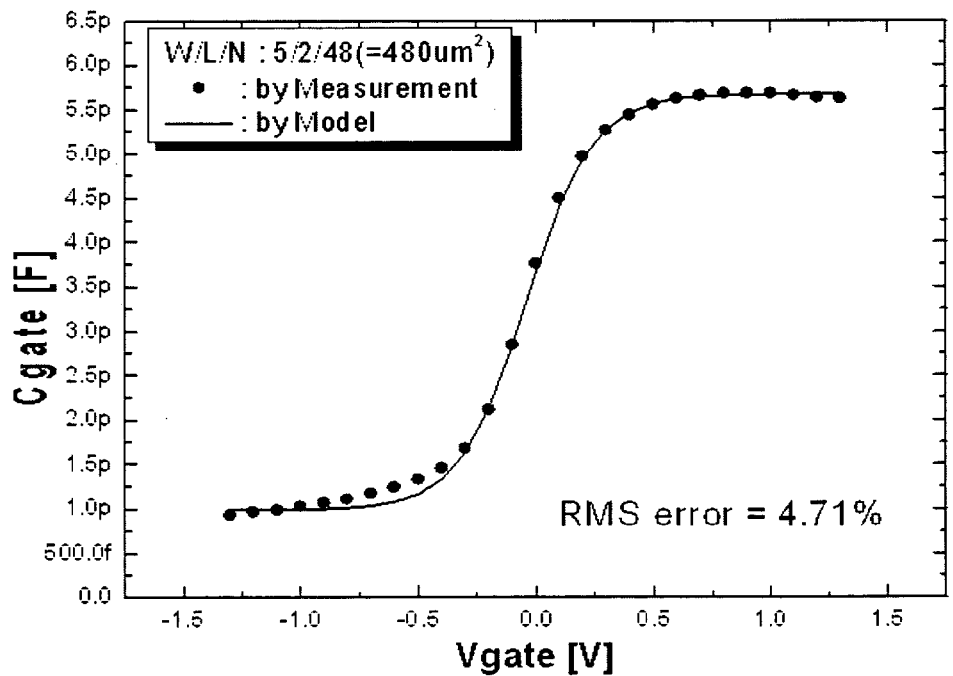

FIG. 10 is a graph reflecting the comparison when a width W, a length L and the number N of fingers are 5 μm, 2 μm and 48, respectively. Here, the total area of the gate is 480 μm$^2$. As illustrated in FIG. 10, it can be seen that the estimated values are close to the actually measured values over the entire S-shaped curve, and the measured RMS error is 4.71%. The measured values are expressed by dots and the values estimated by the MOS varactor model equation of the present invention are expressed by a solid line.

Figure 11:
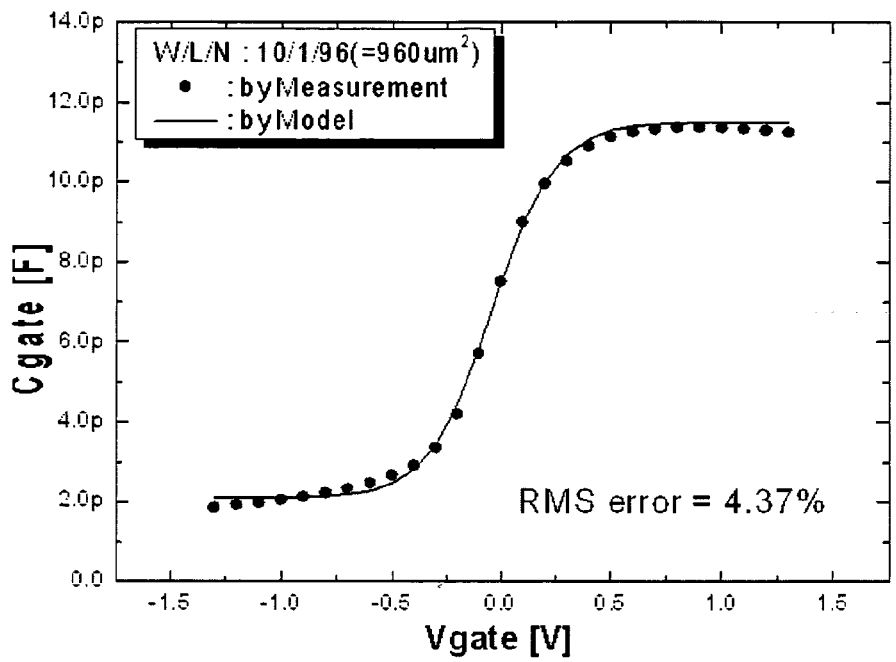

FIG. 11 is a graph reflecting the comparison when a width W, a length L and the number N of fingers are 10 μm, 1 μm and 96, respectively. Here, the total area of the gate is 960 μm$^2$. As illustrated in FIG. 11, it can be seen that the estimated values are close to the actually measured values over the entire S-shaped curve, and the measured RMS error is 4.37%. The measured values are expressed by dots and the values estimated by the MOS varactor model equation of the present invention are expressed by a solid line.

Figure 12:
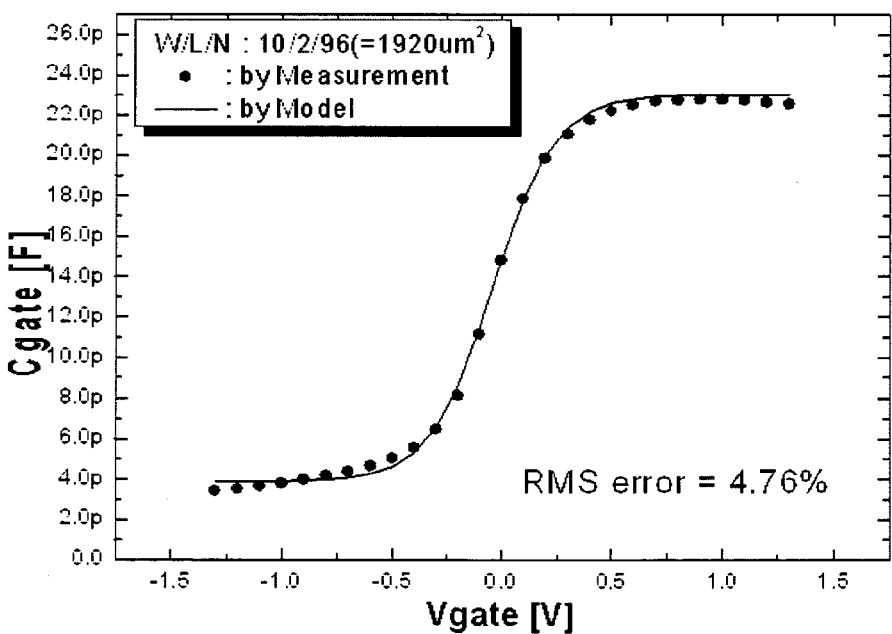

FIG. 12 is a graph reflecting the comparison when a width W, a length L and the number N of fingers are 10 μm, 2 μm and 96, respectively. Here, the total area of the gate is 1920 μm$^2$. As illustrated in FIG. 12, it can be seen that the estimated values are close to the actually measured values over the entire S-shaped curve, and the measured RMS error is 4.76%. The measured values are expressed by dots and the values estimated by the MOS varactor model equation of the present invention are expressed by a solid line.

Figure 13:
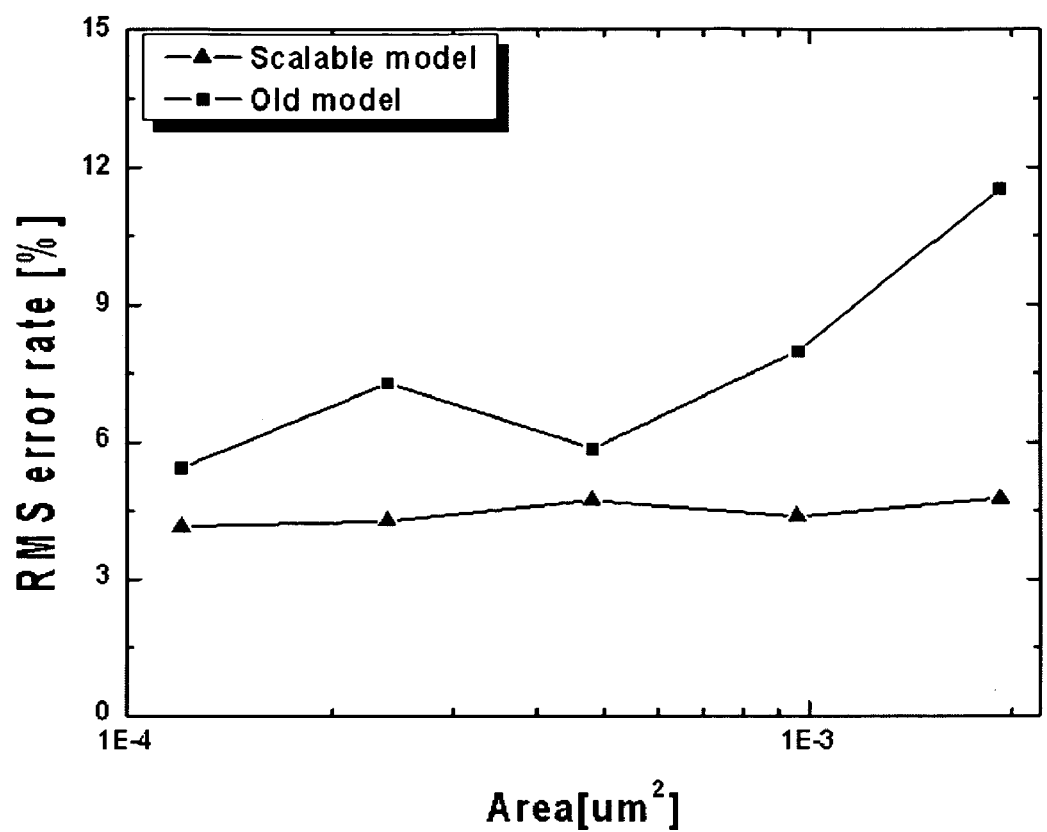
FIG. 13 is a graph illustrating a comparison of an RMS error by a MOS varactor model equation according to the present invention and an RMS error by a conventional MOS varactor model equation.

As described above, it can be understood that the values estimated by the MOS varactor model equation of the present invention more closely coincide with the actually measured values, and the MOS varactor model equation of the present invention acquires far better results as compared to the RMS error of the conventional MOS varactor model equation as illustrated in FIG. 13.

FIG. 13 is a graph illustrating a comparison of both the RMS error from the MOS varactor model equation according to the present invention and the RMS error from the conventional MOS varactor model equation.

That is, according to the MOS varactor model equation of the present invention, the gate capacitance values for the voltage applied to the gate can be estimated using the area component and the perimeter component of a capacitor, so that it is possible to obtain effective values more closely approximating actually measured values.

Accordingly, when the MOS varactor model equation of the present invention is used, it is possible to more precisely estimate the properties of a capacitor. Further, the MOS varactor model equation can be more usefully applied to design an RF application device.

A MOS varactor model equation can be established using the MOS varactor model equation of the present invention considering the area and perimeter of a gate and the number of gate fingers, the values of coefficients constituting the MOS varactor model equation can be calculated through measurements for test materials, and the properties of a capacitor of a MOS varactor can be extracted using the calculated coefficient values, so that it is possible to easily detect the properties of the MOS varactor.

Further, the properties of the MOS varactor can be detected using the MOS varactor model equation of the present invention, so that it is possible to manufacture a MOS varactor by using the detected properties, which has the various areas and perimeters of gates and the various numbers of gate fingers.

According to a MOS varactor property detection method as described above, a MOS varactor model equation applicable to various areas and perimeters of a capacitor is proposed, so that it is possible to estimate gate capacitance for voltage applied to a gate considering the differences due to the surface shapes of a device.

I claim:

1. A method for detecting properties of a Metal Oxide Silicon (MOS) varactor, the method comprising the steps of:
    obtaining a layout of the MOS varactor;
    calculating a total area of a gate in the layout of the MOS varactor;
    establishing a MOS varactor model equation considering the total area of the gate in the layout of the MOS varactor, wherein establishing the MOS varactor model equation further considers a perimeter of the gate in the layout of the MOS varactor;
    calculating values of coefficients of the MOS varactor model equation through measurements for test materials; and
    extracting the properties of a capacitor of the MOS varactor by using the calculated values of the coefficients.

2. The method according to claim 1, wherein establishing the MOS varactor model equation further considers a number of gate fingers of the gate.

3. A method for detecting properties of a Metal Oxide Silicon (MOS) varactor, the method comprising the steps of:
    obtaining a layout of the MOS varactor;
    calculating a total area of a gate in the layout of the MOS varactor;
    establishing a MOS varactor model equation considering the total area of the gate in the layout of the MOS varactor;
    calculating values of coefficients of the MOS varactor model equation through measurements for test materials; and
    extracting the properties of a capacitor of the MOS varactor by using the calculated values of the coefficients,
    wherein establishing the MOS varactor model equation further considers both a perimeter of the gate and a number of gate fingers of the gate in the layout of the MOS varactor.

4. The method according to claim 3, wherein the MOS varactor model equation is expressed by $$C_{gate} = [Ci_{gate} \times \text{Area} + Cp_{gate} \times \text{Perimeter}] \times N$$

where, $C_{gate}$ denotes gate capacitance for voltage applied to the gate, $Ci_{gate}$ denotes intrinsic gate capacitance, $Cp_{gate}$ denotes perimeter gate capacitance, and N denotes the number of gate fingers.

5. The method according to claim 4, wherein $Ci_{gate}$ is expressed by $$Ci_{gate} = Ci_{gmin0} + dCi_{go} \times \left[1 + \tanh\left(\frac{V_g - dVi_{gs0}}{Vi_{gnorm}}\right)\right]$$

where, $Ci_{g\,min\,0}$, $dCi_{go}$, $dVi_{gs0}$ and $Vi_{gnorm}$ denote intrinsic gate capacitance coefficients.

6. The method according to claim 4, wherein $Cp_{gate}$ is expressed by $$Cp_{gate} = Cp_{gmin0} + dCp_{go} \times \left[1 + \tanh\left(\frac{V_g - dVp_{gs0}}{Vp_{gnorm}}\right)\right]$$

where, $Cp_{g\,min\,0}$, $dCp_{go}$, $dVp_{gs0}$ and $Vp_{gnorm}$ denote perimeter gate capacitance coefficients.

7. The method according to claim 3, wherein an error between an estimated value of voltage and an actually measured value of the MOS varactor has a range of 4.14 to 4.76%, the voltage being applied to both the capacitor of the MOS varactor and the gate, the capacitor being extracted by the MOS varactor model equation.

8. A method for manufacturing a Metal Oxide Silicon (MOS) varactor, the method comprising the steps of:
    obtaining a layout of the MOS varactor;
    calculating a total area of a gate in the layout of the MOS varactor;
    establishing a MOS varactor model equation considering the total area of the gate in the layout of the MOS varactor, wherein establishing the MOS varactor model equation further considers a perimeter of the gate in the layout of the MOS varactor;
    calculating values of coefficients of the MOS varactor model equation through measurements for test materials;
    extracting the properties of a capacitor of the MOS varactor by using the calculated values of the coefficients; and
    manufacturing the MOS varactor by using the extracted properties of the capacitor.

9. The method according to claim 8, wherein establishing the MOS varactor model equation further considers a number of gate fingers of the gate.

10. A method for manufacturing a Metal Oxide Silicon (MOS) varactor, the method comprising the steps of:
obtaining a layout of the MOS varactor;
calculating a total area of a gate in the layout of the MOS varactor;
establishing a MOS varactor model equation considering the total area of the gate in the layout of the MOS varactor;
calculating values of coefficients of the MOS varactor model equation through measurements for test materials;
extracting the properties of a capacitor of the MOS varactor by using the calculated values of the coefficients; and
manufacturing the MOS varactor by using the extracted properties of the capacitor,
wherein establishing the MOS varactor model equation further considers both a perimeter of the gate and a number of gate fingers of the gate in the layout of the MOS varactor.

11. The method according to claim 10, wherein the MOS varactor model equation is expressed by $$C_{gate} = [Ci_{gate} \times \text{Area} + Cp_{gate} \times \text{Perimeter}] \times N$$

where, $C_{gate}$ denotes gate capacitance for voltage applied to the gate, $Ci_{gate}$ denotes intrinsic gate capacitance, $Cp_{gate}$ denotes perimeter gate capacitance, and N denotes the number of gate fingers.

12. The method according to claim 11, wherein $Ci_{gate}$ is expressed by $$Ci_{gate} = Ci_{gmin0} + dCi_{go} \times \left[1 + \tanh\left(\frac{V_g - dVi_{gs0}}{Vi_{gnorm}}\right)\right]$$

where, $Ci_{g\ min\ 0}$, $dCi_{go}$, $dVi_{gs0}$, and $Vi_{gnorm}$ denote intrinsic gate capacitance coefficients.

13. The method according to claim 11, wherein $Cp_{gate}$ expressed by $$Cp_{gate} = Cp_{gmin0} + dCp_{go} \times \left[1 + \tanh\left(\frac{V_g - dVp_{gs0}}{Vp_{gnorm}}\right)\right]$$

where, $Cp_{g\ min\ 0}$, $dCp_{go}$, $dVp_{gs0}$ and $VP_{gnorm}$ denote perimeter gate capacitance coefficients.

* * * * *